United States Patent
Jang et al.

(10) Patent No.: US 8,441,297 B2
(45) Date of Patent: May 14, 2013

(54) PMOS RESISTOR

(75) Inventors: Seunghyun Jang, Daejeon (KR); Jae Ho Jung, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 13/332,578

(22) Filed: Dec. 21, 2011

(65) Prior Publication Data

US 2012/0154029 A1 Jun. 21, 2012

(30) Foreign Application Priority Data

Dec. 21, 2010 (KR) ........................ 10-2010-0131455

(51) Int. Cl.
*H03L 5/00* (2006.01)

(52) U.S. Cl.
USPC ........................................ 327/308; 333/81 R

(58) Field of Classification Search .................. 327/306, 327/308; 333/81 R
See application file for complete search history.

(56) References Cited

U.S. PATENT DOCUMENTS 4,975,604 A * 12/1990 Barta ............................ 327/308
7,521,980 B2 * 4/2009 Koen ........................... 327/308

OTHER PUBLICATIONS

Sang-Gyu Park, A RF CMOS Base-band Analog Circuit for IEEE 802.11a/b/g/n WLAN Transceiver, The 2nd European Wireless Technology Conference, Sep. 2009, pp. 254-257, Rome, Italy.
Mihai Banu, Fully Integrated Active RC Filters in MOS Technology, IEEE Journal of Solid-State Circuits, Dec. 1983, pp. 644-651, vol. 18 No. 6.

* cited by examiner

*Primary Examiner* — Dinh T. Le
(74) *Attorney, Agent, or Firm* — William Park & Associates Patent Ltd.

(57) ABSTRACT

Provided is a PMOS resistor. The PMOS resistor includes a PMOS transistor pair, a switching unit, and a negative feedback unit. The PMOS transistor pair is symmetrically connected between first and second nodes. The switching unit compares a voltage of the first node and a voltage of the second node to output one of the voltages of the first and second nodes. The negative feedback unit receives an output of the switching unit to control a current which flows in the PMOS transistor pair, for maintaining a constant resistance value.

12 Claims, 3 Drawing Sheets

PMOS RESISTOR

CROSS-REFERENCE TO RELATED APPLICATIONS

This U.S. non-provisional patent application claims priority under 35 U.S.C. §119 of Korean Patent Application No. 10-2010-0131455, filed on Dec. 21, 2010, the entire contents of which are hereby incorporated by reference.

BACKGROUND OF THE INVENTION

The present invention disclosed herein relates to a PMOS resistor.

In integrated circuits, area consumption is large when a resistor higher than mega ohm (Mohm) is implemented using a poly resistor. To solve such a limitation, research is being conducted on methods where by applying negative feedback to a P-channel Metal-Oxide-Semiconductor (PMOS) field-effect transistor, the small area is occupied and a high resistance value is obtained.

SUMMARY OF THE INVENTION

The present invention provides a PMOS transistor in which resistance characteristic is not largely changed according to level of an applied voltage.

Embodiments of the present invention provide a PMOS resistor including: a PMOS transistor pair symmetrically connected between first and second nodes; a switching unit comparing a voltage of the first node and a voltage of the second node to output one of the voltages of the first and second nodes; and a negative feedback unit receiving an output of the switching unit to control a current which flows in the PMOS transistor pair, for maintaining a constant resistance value.

In some embodiments, the PMOS transistor pair may include: a first PMOS transistor connected between the first and second nodes; and a second PMOS transistor connected between the first and second nodes, wherein a gate of the first PMOS transistor is connected to a gate of the second PMOS transistor.

In other embodiments, a body of the first PMOS transistor may be connected to the second node, and a body of the second PMOS transistor may be connected to the first node.

In still other embodiments, the bodies of the first and second PMOS transistors may be N-wells.

In even other embodiments, the switching unit may output a high voltage among the voltages of the first and second nodes.

In yet other embodiments, the switching unit may include: a comparator comparing the voltage of the first node and the voltage of the second node to generate a control signal; a switch outputting one of the voltages of the first and second nodes in response to the control signal; and a buffer buffering an output of the switch.

In further embodiments, the control signal may have a high level when the voltage of the first node is higher than the voltage of the second node, and the control signal may have a low level when the voltage of the second node is higher than the voltage of the first node.

In still further embodiments, the negative feedback unit may include: a reference resistor connected between an output terminal of the switching unit and a fourth node; a third PMOS transistor connected between the output terminal of the switching unit and a fifth node; a first current source connected between the fourth node and a ground terminal; a second current source connected between the fifth node and the ground terminal; and an operational amplifier receiving and operating a voltage of the fourth node and a voltage of the fifth node to output the operated voltage to a sixth node, wherein the sixth node is connected to gates of the first to third PMOS transistors.

In even further embodiments, the sizes of the first to third PMOS transistors may be the same.

In yet further embodiments, when the voltage of the fourth node is the same as the voltage of the fifth node, a drain-source resistance ($R_{PMOS}$) of each of the first to third PMOS transistors may satisfy Equation below, $$R_{PMOS} = R_{ref} \cdot I_{ref1} / I_{ref2}$$

where $R_{ref}$ is a resistance value of the reference resistor, $I_{ref1}$ is a current value flowing in the first current source, and $I_{ref2}$ is a current value flowing in the second current source.

In much further embodiments, a resistance value of the PMOS resistor may be a resistance value as seen from the first and second nodes.

In still much further embodiments, a resistance value of the PMOS resistor may be a resistance value in which a drain-source resistance of the first PMOS transistor and a drain-source resistance of the second PMOS transistor are connected in parallel.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

Figure 1:
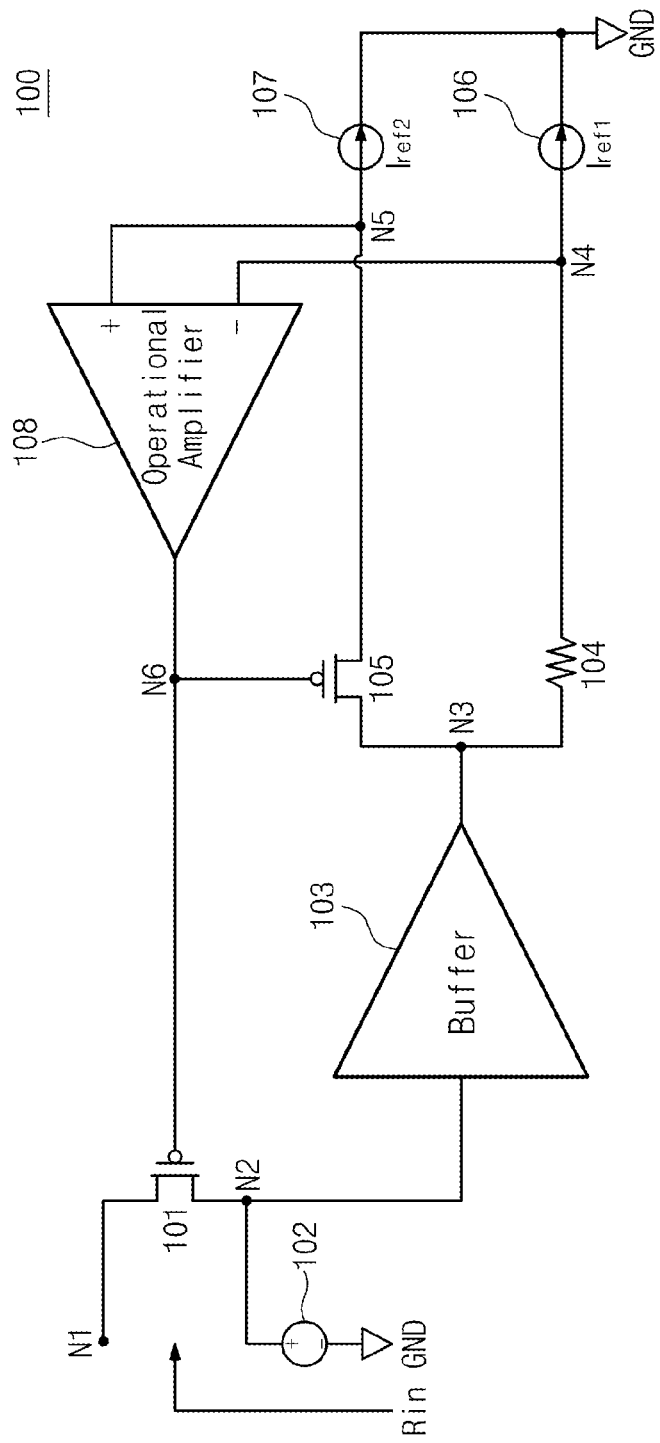
FIG. 1 is a circuit diagram illustrating a typical PMOS resistor.

FIG. 1 is a circuit diagram illustrating a typical PMOS resistor 100.

Referring to FIG. 1, the typical PMOS resistor 100 includes a PMOS transistor 101, a voltage source 102, a buffer 103, a resistor 104, a transistor 105, first and second current sources 106 and 107, and an operational amplifier 108.

The typical PMOS resistor 100 controls a voltage between a source N2 and gate N6 of the PMOS transistor 101 in order for a very low current to flow to a drain N1 of the PMOS transistor 101 through negative feedback, thereby implementing a constant Metal Oxide Semiconductor Field-Effect Transistor (MOSFET) resistor.

However, the typical PMOS resistor 100 has two limitations.

First, when the voltage of the drain N1 of the PMOS transistor 101 is higher than that of the source N2, the drain N1 of the PMOS transistor 101 no longer operates as a drain but operates as a source. At this point, a current flowing in the PMOS transistor 101 is determined according to a voltage between the gate N6 of the PMOS transistor 101 and the drain N1 that operates as the source. That is, a flowing current varies according to a voltage applied to the drain N1 of the PMOS transistor 101. Particularly, a high current flows in the PMOS transistor 101, and thus the PMOS resistor 100 no longer have a high resistance component. In addition, negative feedback cannot control the current flowing in the PMOS transistor 101.

Second, when the voltage of the drain N1 of the PMOS transistor 101 is higher than that of the source N2, a drain voltage is inputted to the buffer 103. Although the voltage of the gate N6 of the PMOS transistor 101 is controlled, due to the drain voltage inputted to the buffer 103, the resistance characteristic of the PMOS transistor 101 differs from the resistance characteristic of a case where the voltage of the drain N1 of the PMOS transistor 101 is lower than that of the source N2. This is because the source N2 of the PMOS transistor 101 is physically connected to an N-well being a body. That is, even when a negative feedback operation is performed with respect to the drain voltage, the N-well that is required to be connected to the highest voltage in the PMOS resistor 100 is connected to the lowest voltage therein. Due to this reason, body-effect arises largely.

To provide a summary, the typical PMOS resistor 100 has different resistance characteristics according to the voltage applied to the drain N1 of the PMOS transistor 101, and moreover, resistance performance is not constant.

A PMOS resistor according to an embodiment of the present invention connects a high voltage to an N-well being a body of a PMOS transistor irrespective of an applied voltage, thereby having constant resistance characteristic.

Figure 2:
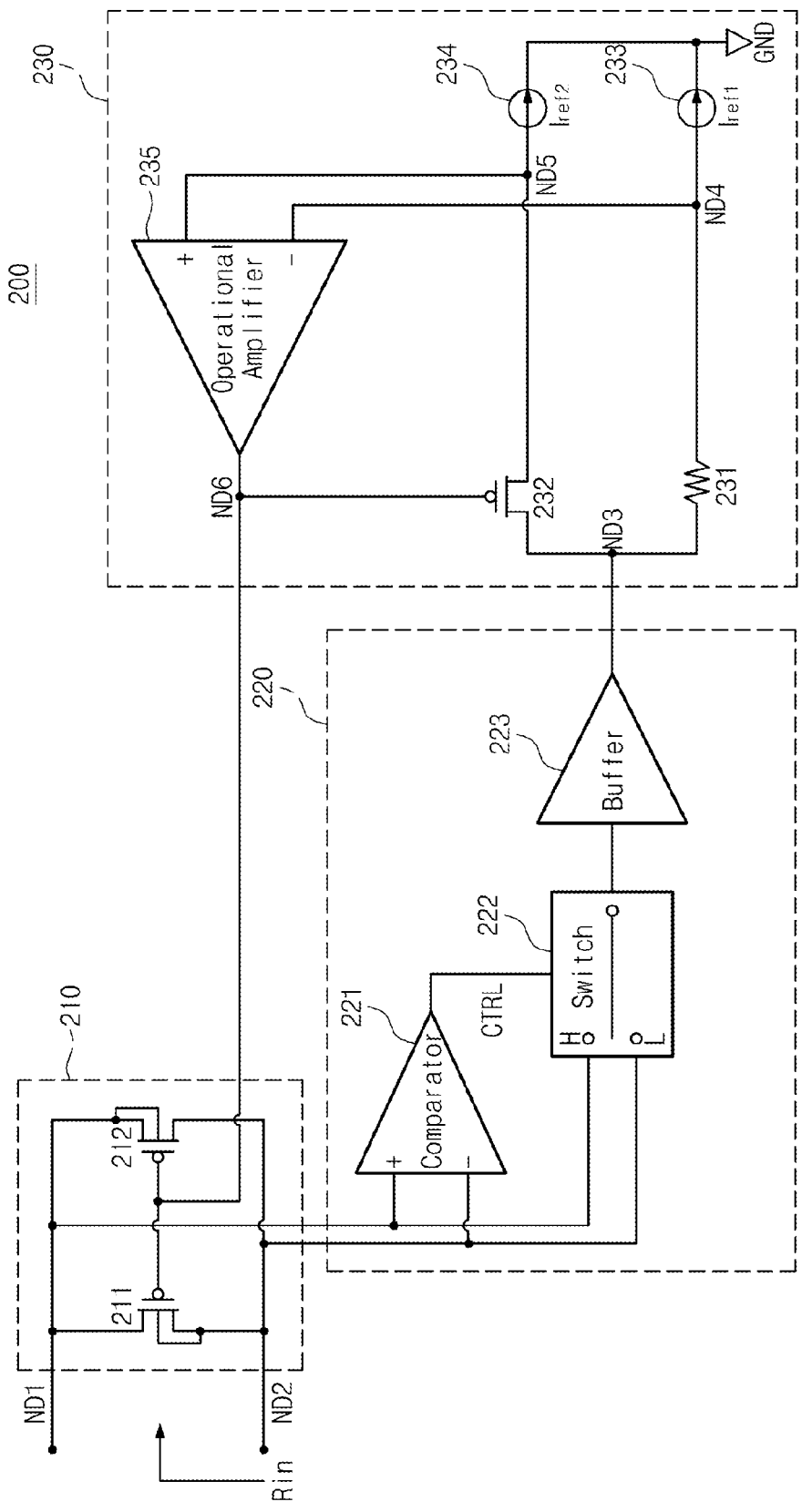
FIG. 2 is a circuit diagram illustrating a PMOS resistor according to an embodiment of the present invention.

FIG. 2 is a circuit diagram illustrating a PMOS resistor 200 according to an embodiment of the present invention.

Referring to FIG. 2, the PMOS resistor 200 includes a PMOS pair 210, a switching unit 220, and a negative feedback unit 230.

The PMOS pair 210 includes a first PMOS transistor 211, and a second PMOS transistor 212. The first and second PMOS transistors 211 and 212 are symmetrical in structure. That is, a source of the first PMOS transistor 211 is connected to a drain of the second PMOS transistor 212, and a drain of the first PMOS transistor 211 is connected to a source of the second PMOS transistor 212.

The first PMOS transistor 211 has a drain connected to a first node ND1, a source connected to a second node ND2, and a gate connected to a sixth node ND6. A body of the first PMOS transistor 211 is connected to the source. Herein, the body of the first PMOS transistor 211 may be an N-well.

The second PMOS transistor 212 has a drain connected to the second node ND2, a source connected to the first node ND1, and a gate connected to the sixth node ND6. A body of the second PMOS transistor 212 is connected to the source. Herein, the body of the second PMOS transistor 212 may be an N-well.

The PMOS pair 210 is configured with the first and second PMOS transistors 211 and 212 that are symmetrical, and thus, an equivalent circuit as seen from the first node ND1 is the same as an equivalent circuit as seen from the second node ND2. Therefore, all effects including body-effect are shown symmetrically. Moreover, even when various voltages are applied to the first and second nodes ND1 and ND2, the PMOS pair 210 has constant resistance characteristic.

The switching unit 220 compares the voltages of the first and second nodes ND1 and ND2 to determine negative feedback. The switching unit 220 includes a comparator 221, a switch 222, and a buffer 223.

The comparator 221 receives the voltage of the first node ND1 through a positive input terminal (+), receives the voltage of the second node ND2 through a negative input terminal (−), and compares the voltages of the first and second nodes ND1 and ND2 to generate a control signal CTRL.

For example, when the voltage of the first node ND1 is higher than that of the second node ND2, the control signal CTRL has a high level (H). On the other hand, when the voltage of the first node ND1 is not higher than that of the second node ND2, the control signal CTRL has a low level (L). Herein, the high level (H) may correspond to a power source voltage, and the low level (L) may correspond to a ground voltage.

The switch 222 selectively switches the voltage of the first node ND1 or the voltage of the second node ND2 in response to the control signal CTRL. For example, when the control signal CTRL having a high level (H) is inputted, the switch 222 outputs the voltage of the first node ND1. On the other hand, when the control signal CTRL having a low level (L) is inputted, the switch 222 outputs the voltage of the second node ND2.

The buffer 223 temporarily buffers the voltage of the first node ND1 or the voltage of the second node ND2 that is received from the switch 222.

The switching unit 220 transfers a high voltage among the voltages of the first and second nodes ND1 and ND2 to the negative feedback unit 230.

The negative feedback unit 230 receives the output voltage of the switching unit 220 and controls the source-gate voltages of the first and second PMOS transistors 211 and 211 of the PMOS pair 210 through negative feedback. In an embodiment of the present invention, the negative feedback unit 230 controls the voltage of the sixth node ND6 connected to the gates of the first and second PMOS transistors 211 and 211.

The negative feedback unit 230 includes a reference resistor 231, a third PMOS transistor 232, first and second current sources 233 and 234, and an operational amplifier 235.

The reference resistor 231 is connected to an output terminal of the buffer 223 of the switching unit 222 and a fourth node ND4. The third PMOS transistor 232 is connected between an output terminal of the switching unit 222 and a fifth node ND5. The first current source 233 is connected between the fourth node ND4 and a ground terminal GND. The second current source 234 is connected between the fifth node ND5 and the ground terminal GND. The operational amplifier 235 includes a negative input terminal (−) connected to the fourth node ND4, a positive input terminal (+) connected to the fifth node ND5, and an output terminal connected to the sixth node ND6. Herein, the sixth node ND6 is connected to a gate of the third PMOS transistor 232.

Hereinafter, a method of controlling a resistance value of the negative feedback unit 230 will be described. The output of the buffer 223 of the switching unit 222 is a source voltage of the PMOS pair 210. Therefore, the negative feedback unit 230 controls a gate voltage of the PMOS pair 210 through negative feedback, for controlling a current that controls a drain-source resistance value of the PMOS pair 210 on the basis of the output of the buffer 223.

In detail, when the voltage of the fourth node ND4 is the same as that of the fifth node ND5, a drain-source resistance of the third PMOS transistor 232 satisfies Equation (1) below.

$$R_{PMOS} = R_{ref} \cdot I_{ref1} / I_{ref2} \tag{1}$$

where $R_{ref}$ is a resistance value of the reference resistor 231, $I_{ref1}$ is a current value flowing in the first current source 233, and $I_{ref2}$ is a current value flowing in the second current source 234.

The operational amplifier 235 allows the voltages of the fourth and fifth nodes ND4 and ND5 to be identical. The operational amplifier 235 receives the voltages of the fourth and fifth nodes ND4 and ND5 and transfers an output signal to the gate of the third PMOS transistor 232 in order to form negative feedback. By forming the negative feedback, the voltages of the fourth and fifth nodes ND4 and ND5 converge to zero.

At this point, when the first to third PMOS transistors 211, 212 and 232 have the same size, a current having the same level as that of a current flowing in the third PMOS transistor 232 flows in the first and second PMOS transistors 211 and 212 because the output of the operational amplifier 235 of the negative feedback 230 is connected to the gates of the first and second PMOS transistors 211 and 212. Therefore, each of the first and second PMOS transistors 211 and 212 has the resistance value that is expressed as the Equation (1).

Accordingly, a resistance ($R_{in}$) as seen through both ends of the first and second nodes ND1 and ND2 of the PMOS resistor 200 is expressed as the following Equation (2) where two resistance values ($R_{PMOS}$) are connected in parallel.

$$R_{in} = R_{PMOS} // R_{PMOS} \quad (2)$$

When the voltage of the first node ND1 is higher than that of the second node ND2, body-effect does not almost occur in the second PMOS transistor 212, but body-effect occurs in the first PMOS transistor 211. Since the voltage of the first node ND1 is high, the terminal of the first PMOS transistor 211 connected to the first node ND1 operates as a source, and a source voltage becomes higher than a body voltage connected to the second node ND2. Therefore, body-effect allows a threshold voltage of the first PMOS transistor 211 to further decrease. The decreased threshold voltage allows a relatively higher current to flow through the first PMOS transistor 211 at the same gate voltage, and thus a resistance value decreases.

Even when the voltage of the second node ND2 is higher than that of the first node ND1, a case similar to the above described occurs, and thus, a threshold voltage of the second PMOS transistor 211 decreases, thereby decreasing a resistance value. The resistance ($R_{in}$) as seen through the first and second nodes ND1 and ND2 is obtained by connecting in parallel resistances decreased in proportion to $R_{PMOS}$ expressed as the Equation (1) and a more flowing current equal to the decreased threshold voltage due to the body-effect in $R_{PMOS}$.

Figure 3:
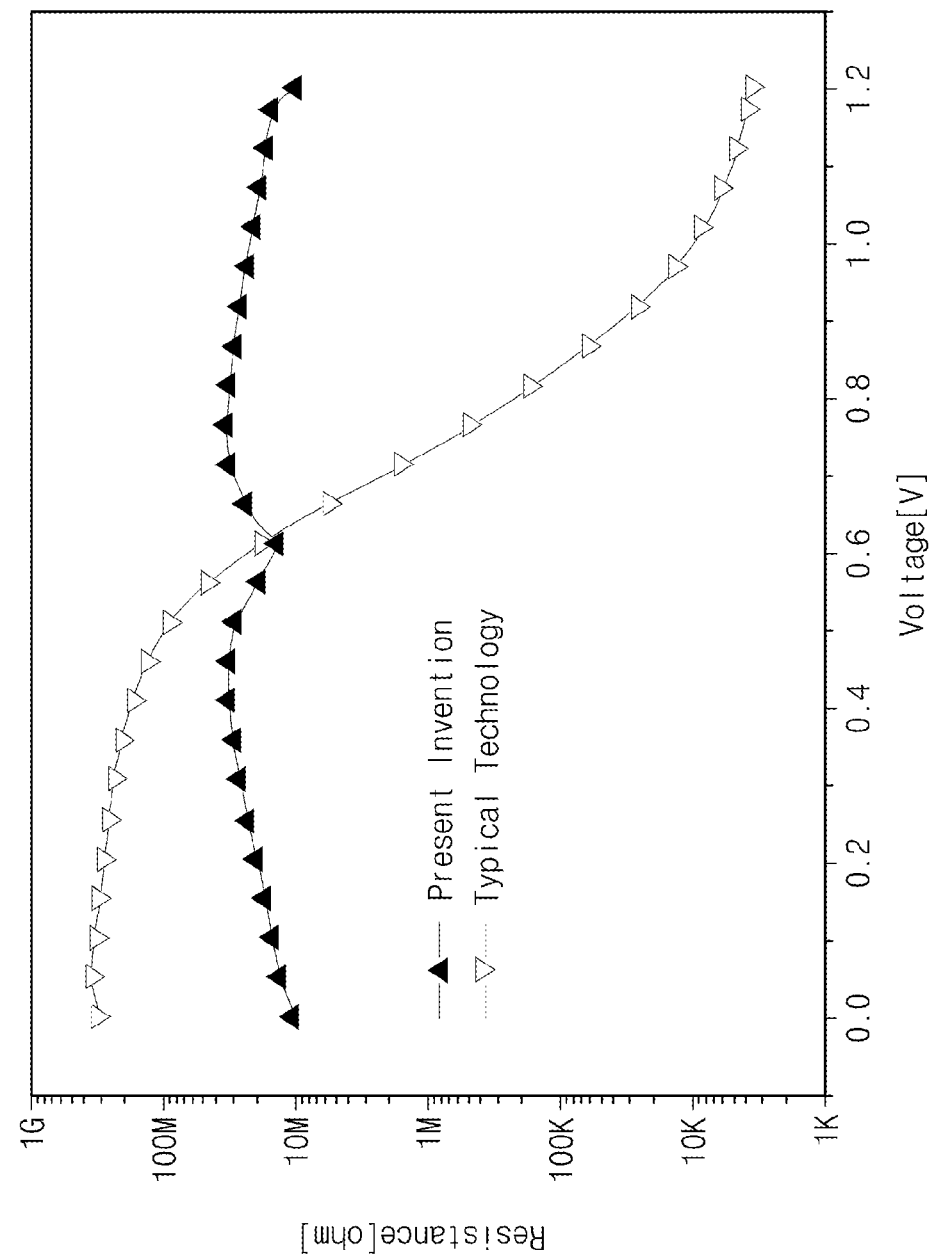
FIG. 3 is a diagram comparing change of resistance characteristics based on levels of input voltages in the typical PMOS resistor and the PMOS resistor according to an embodiment of the present invention.

FIG. 3 is a diagram comparing change of resistance characteristics based on levels of input voltages in the typical PMOS resistor 100 and the PMOS resistor 200 according to an embodiment of the present invention.

Conditions used in simulation of the typical PMOS resistor 100 are as follows. A source voltage of the PMOS transistor 101 is about 0.6V, and a drain voltage is shifted from about 0V to about 1.2V. Levels of the PMOS transistors 101 and 104 are the same, a resistance value of the reference resistor 104 is about 100 Kohm, a current ($I_{ref1}$) flowing in the first current source 106 is about 1 uA, and a current ($I_{ref2}$) flowing in the second current source 107 is about 1 nA. As shown in FIG. 3, the typical PMOS resistor 100 shows different resistance characteristics according to an applied drain voltage. Particularly, when the drain voltage is higher than the source voltage, the resistance value decreases rapidly. As shown in FIG. 3, maximum and minimum resistance components are a maximum of about 346 Mohm at about 0.1V and are a minimum of about 3.6 Kohm at about 1.2V, and therefore, the difference is considerably large as 96000 times.

Conditions used in simulation of the PMOS resistor 200 according to an embodiment of the present invention are as follows. A voltage of the second node ND2 is about 0.6V, and a voltage of the first node ND1 is shifted from about 0.0V to about 1.2V. Levels of the first to third PMOS transistors 211, 212 and 232 are the same, a resistance value of the reference resistor 231 is about 100 Kohm, a current ($I_{ref1}$) flowing in the first current source 233 is about 1 uA, and a current ($I_{ref2}$) flowing in the second current source 234 is about 1 nA.

As shown in FIG. 3, it can be seen that a constant resistance value of the PMOS resistor 200 is relatively maintained. The maximum resistance value of the PMOS resistor 200 is a maximum of about 33 Mohm when the voltage of the first node ND1 is about 4.46V, and the minimum resistance value of the PMOS resistor 200 is a minimum of about 10 Mohm when the voltage of the first node ND1 is about 1.2V. The difference is 3.3 times and is far smaller than a typical difference. That is, the PMOS resistor 200 has a constant resistance value.

As described above, the PMOS transistor according to the embodiment of the present invention uses the symmetrical PMOS transistor pair in structure, and thus can maintain a constant resistance value irrespective of level of an applied voltage.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A PMOS resistor comprising:
a PMOS transistor pair symmetrically connected between first and second nodes;
a switching unit comparing a voltage applied externally to the first node and a voltage applied externally to the second node to output one of the voltages of the first and second nodes; and
a negative feedback unit receiving an output of the switching unit to control a current which flows in the PMOS transistor pair, for maintaining a constant resistance value.

2. The PMOS resistor of claim 1, wherein the PMOS transistor pair comprises:
a first PMOS transistor connected between the first and second nodes; and
a second PMOS transistor connected between the first and second nodes,
wherein a gate of the first PMOS transistor is connected to a gate of the second PMOS transistor.

3. The PMOS resistor of claim 2, wherein:
a body of the first PMOS transistor is connected to the second node, and
a body of the second PMOS transistor is connected to the first node.

4. The PMOS resistor of claim 3, wherein the bodies of the first and second PMOS transistors are N-wells.

5. The PMOS resistor of claim 4, wherein the switching unit outputs a high voltage among the voltages of the first and second nodes.

6. The PMOS resistor of claim 4, wherein the switching unit comprises:
a comparator comparing the voltage of the first node and the voltage of the second node to generate a control signal;
a switch outputting one of the voltages of the first and second nodes in response to the control signal; and
a buffer buffering an output of the switch.

7. The PMOS resistor of claim 6, wherein:
when the voltage of the first node is higher than the voltage of the second node, the control signal has a high level, and
when the voltage of the second node is higher than the voltage of the first node, the control signal has a low level.

8. The PMOS resistor of claim 4, wherein the negative feedback unit comprises:
a reference resistor connected between an output terminal of the switching unit and a fourth node;
a third PMOS transistor connected between the output terminal of the switching unit and a fifth node;
a first current source connected between the fourth node and a ground terminal;
a second current source connected between the fifth node and the ground terminal; and
an operational amplifier receiving and operating a voltage of the fourth node and a voltage of the fifth node to output the operated voltage to a sixth node,
wherein the sixth node is connected to gates of the first to third PMOS transistors.

9. The PMOS resistor of claim 8, wherein the sizes of the first to third PMOS transistors are the same.

10. The PMOS resistor of claim 9, wherein when the voltage of the fourth node is the same as the voltage of the fifth node, a drain-source resistance (RPMOS) of each of the first to third PMOS transistors satisfies Equation below, $$RPMOS = Rref \cdot Iref1 / Iref2$$

where Rref is a resistance value of the reference resistor, Iref1 is a current value flowing in the first current source, and Iref2 is a current value flowing in the second current source.

11. The PMOS resistor of claim 10, wherein a resistance value of the PMOS resistor is a resistance value as seen from the first and second nodes.

12. The PMOS resistor of claim 10, wherein a resistance value of the PMOS resistor is a resistance value in which a drain-source resistance of the first PMOS transistor and a drain-source resistance of the second PMOS transistor are connected in parallel.

* * * * *